United States Patent [19]

Chapotot

[11] Patent Number: 4,835,460
[45] Date of Patent: May 30, 1989

[54] DISPLAY DEVICE OF THE GALVANOMETRIC OR LOGOMETRIC TYPE, INCLUDING A CONTROL CIRCUIT IN FORM OF AN INTEGRATED CIRCUIT CHIP

[75] Inventor: Michel Chapotot, Taverny, France

[73] Assignee: Jaeger, Lavallois Perret, France

[21] Appl. No.: 125,384

[22] Filed: Nov. 25, 1987

[30] Foreign Application Priority Data

Nov. 26, 1986 [FR] France ................. 86 16473

[51] Int. Cl.[4] .......... G01R 1/04; G01R 13/38; H05K 3/02
[52] U.S. Cl. .................... 324/97; 324/157; 29/846
[58] Field of Search .......... 324/96, 97, 154 R, 156, 324/157; 73/431; 29/846, 854

[56] References Cited

U.S. PATENT DOCUMENTS

| | | | |
|---|---|---|---|
| 3,502,984 | 3/1970 | Mincuzzi | 324/157 |
| 3,829,648 | 8/1974 | Huddleston | 200/264 |
| 4,370,613 | 1/1983 | Montagu | 324/154 R |
| 4,694,572 | 9/1987 | Leber et al. | 29/846 |

FOREIGN PATENT DOCUMENTS

| | | |
|---|---|---|
| 0192349 | 8/1986 | European Pat. Off. . |
| 2908160 | 3/1979 | Fed. Rep. of Germany . |
| 2087590 | 12/1971 | France . |
| 2412737 | 7/1979 | France . |

Primary Examiner—Reinhard J. Eisenzopf
Assistant Examiner—Walter E. Snow
Attorney, Agent, or Firm—Fleit, Jacobson, Cohn & Price

[57] ABSTRACT

The present invention relates to a display device with a winding and pivoting elements, of the galvanometric or logometric type. According to the invention the display device comprises, rigid with its case, a support of electrically insulating material, which carries on the one hand at least one integrated circuit chip serving as a control circuit for the device, and on the other hand a series of strips of electrically conductive material, adapted for connecting the integrated circuit chip and at least one winding of the device and for receiving electrical control signals generated by external circuits.

6 Claims, 3 Drawing Sheets

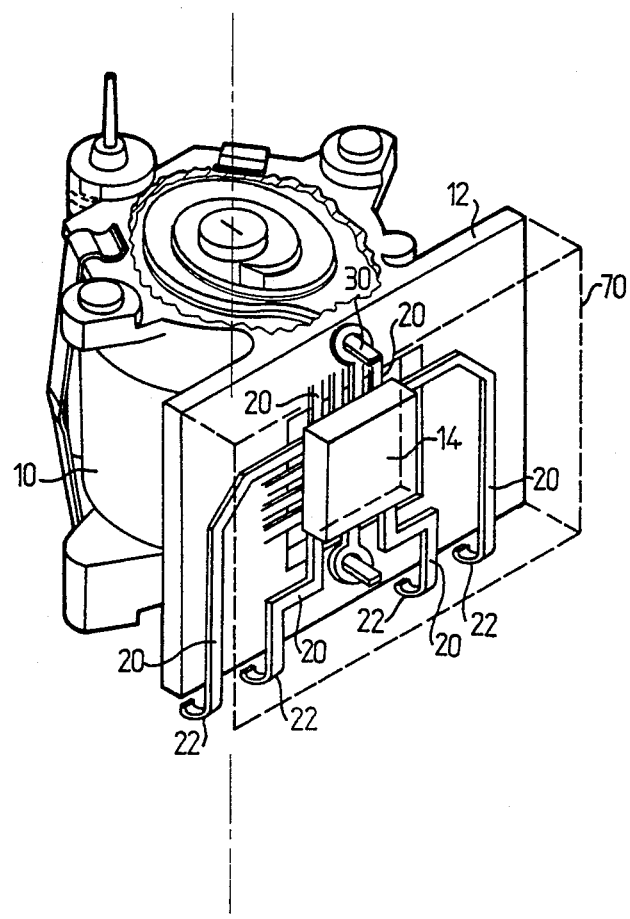
FIG_1

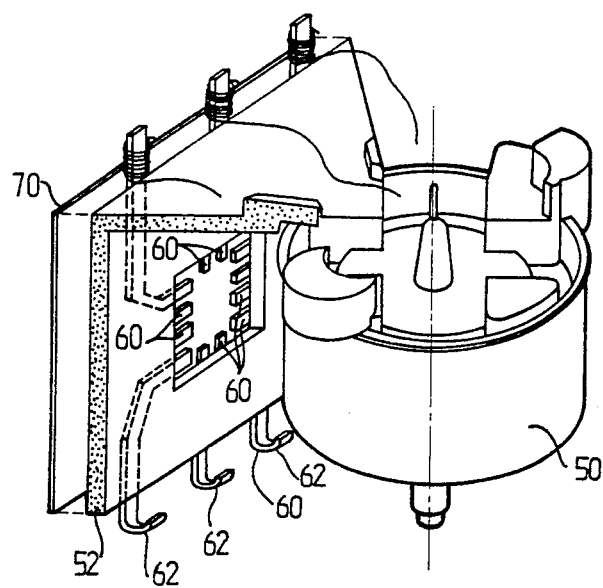
FIG_2

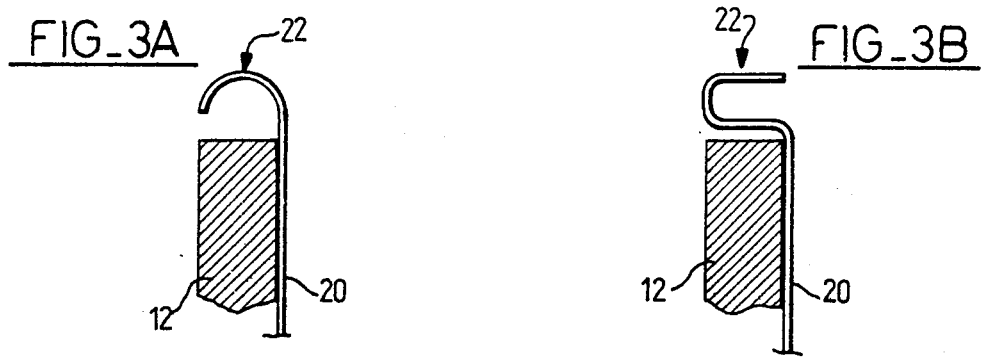
FIG_3A  FIG_3B
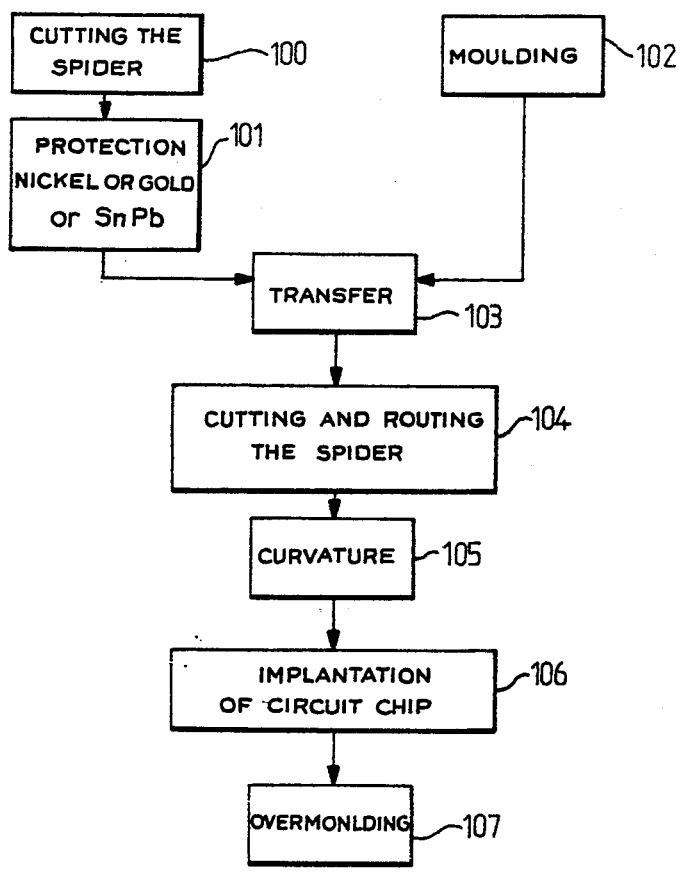
FIG_4

DISPLAY DEVICE OF THE GALVANOMETRIC OR LOGOMETRIC TYPE, INCLUDING A CONTROL CIRCUIT IN FORM OF AN INTEGRATED CIRCUIT CHIP

FIELD OF THE INVENTION

The present invention relates to the field of display devices with a winding and pivoting elements of the galvanometric or logometric type.

BACKGROUND OF THE INVENTION

It will be recalled that galvanometers comprise pivoting elements provided with a winding pivotingly carried in the airgap of a magnet. A return spring biasses the elements towards a rest position. When a control current is applied to the winding, the resultant electromagnetic motor couple displaces the pivoting elements. The equilibrium position is obtained when the return couple defined by the spring equals the electromagnetic motor couple.

Logometers comprise pivoting elements provided with a magnet pivotally carried between two crossed windings receiving electric control currents. The movable magnet of the elements aligns itself with the magnetic field generated by the windings.

THE INVENTION

The present invention has the object of proposing a new display device of the galvanometric or logometric type which is compact, reliable and economic.

The applicant has particularly noted that, in a general manner, the series production of display devices of the galvanometric or logometric type does not always achieve devices all having the same transformation law. In practice there exists a particular spread of manufacture and the display devices of the same series are not interchangeable with each other. This of course constitutes an extremely awkward inconvenience.

Another important object of the present invention is thus to provide a display device of the galvanometric or logometric type which eliminates the inevitable spread in their transformation law from electrical control signal to pivot angle of the movable elements.

These different objects are obtained, within the scope of the present invention, thanks to a display device with a winding and pivoting elements, of the galvanometric or logometric type, which comprises fixed to its case a support of electrically insulating material, which carries on the one hand at least one integrated circuit chip serving as a control circuit for the device, and on the other hand a series of strips of electrically conductive material adapted for connecting the printed circuit chip and at least one winding of the device and for receiving electric control signals generated by external circuits.

According to an advantageous characteristic of the invention, the electric contacts established between the strips of electrically conductive material and the external circuits generating the electric control signals, are established at curves provided in the region of the end of the electrically conductive material strips, on the edge of the support.

In the case of a display device of the galvanometric type comprising an electrically conductive return spring, preferably the return spring is connected to one of the electrically conductive material strips carried by the support for ensuring supply of a wining of the movable elements.

According to another advantageous characteristic of the invention the integrated circuit chip comprises an element defining a parameter connected by a transformation law from size of input electric control to pivoting angle of the movable elements of the device.

THE DRAWINGS

Other characteristics, objects and advantages of the present invention will appear from reading the following detailed description with reference to the accompanying drawings given by way of non-limitative example and in which:

FIG. 1 shows a perspective schematic view of a display device of the galvanometric type according to the present invention;

FIG. 2 shows a perspective schematic view of a display device of the logometric type according to the present invention;

FIGS. 3A and 3B illustrate two embodiments according to the present invention of curves arranged at the end of electrically conductive material strips carried by the support, FIG. 4 illustrates in a schematic manner the method of manufacture of display devices according to the present invention.

THE PREFERRED EMBODIMENT

There will be seen in FIGS. 1 and 2 respectively cases 10, 50 of a galvanometer and a logometer.

The structure of these galvanometer and logometer, known in themselves, will not be described in detail below.

According to the present invention a support of electrically insulating material, generally flat, referenced respectively 12 and 52 in FIGS. 1 and 2, is fixed to the cases 10,50. The flat, electrically insulating support 12,52 carries on the one hand at least one integrated circuit chip 14 serving as a control circuit for the device and on the other hand, a series of strips 20,60 of electrically conductive material. The strips 20,60 are intended to connect the integrated circuit chip 14 and at least one winding of the display device. The strips 20,60 are also intended to receive electrical control signals generated by external circuits.

As is illustrated in FIGS. 1 and 2, the electric contacts established between the strips 20,60 of electrically conductive material and the external circuits generating the electrical control signals are established at curves 22,62 provided at the ends of these strips of electrically conductive material 20,60 on the edge of the support 12,52.

The curves 22,62 provided at the end of the strips 20,60 can be made in various different ways. There is illustrated in FIGS. 3A and 3B two embodiments of the curves. These embodiments are of course given by way of example and should not be considered as limitative.

According to the illustration given in FIGS. 3A and 3B each curve 22,62 is formed of a curve in a hemi-circular arc convex towards the outside of the support 12,52.

In the case of a display device of the galvanometric type as illustrated in FIG. 1, preferably the return spring 30 is electrically conductive and is connected to one of the strips 20 carried by the support 12 for ensuring supply of the winding of the movable elements.

In an advantageous manner, according to the invention, the integrated circuit chip 14 comprises an element, for example a memory defining a parameter connected by a transformation law from size of input electric control to pivot angle of the movable elements of the device. The said parameter defined by the integrated circuit chip is personalised for each display device, during manufacture, so that if two display devices having the same transformation law from size of input electric control to pivot angle of the movable elements, differing as a result of manufacturing spread, receive the same electric control signal at the input, the display devices produce the same angle of pivoting of the movable elements. In other words, the control circuit takes account of the said parameter for determining the signal applied to the winding of the display device.

The electrically insulating support 12,52 is preferably made of loaded plastic material able to withstand the known temperatures of wave soldering, for example of polyamide.

The process of manufacture of the display device according to the present invention will now be succinctly described with reference to FIG. 4.

As is illustrated in this Figure, the stage referenced 100, the first phase of the method consists of providing an array of strips of electrically conductive material, generally known as a "spider", adapted for connecting the external circuits generating the electrical control signals, the integrated circuit chip 14 carried by the support 12,52 and at least one winding of the display device.

Such arrays of electrically conductive strips 20,60 can be prepared according to known techniques of producing ribbons for carrying out the process of "automatic strip transfer" presently known as TAB.

More precisely again, the array of electrically conductive strips 20,60 can be provided according to the method consisting of:

providing rectangular windows in a plastic film of electrically insulating material, for example a mylar film, glueing a leaf of copper onto the plastic film, depositing a photo sensitive resin onto the layer of copper, providing an insolation of this through a mask with an appropriate geometry, providing an etching of the copper layer according to any etching method known in itself.

As illustrated by the stage referenced 101 in FIG. 4, the array of electrically conductive strips 20,60 thus provided is then protected by deposit of a protective layer based on nickel or of gold or of SnPb or others.

Parallel to the mentioned stages 100 and 101, it is necessary to operate moulding of the support 12,52 fixed to the case 10,50, as illustrated by the stage referenced 102 in FIG. 4.

As previously indicated, the electrically insulating support 10,50 is preferably provided in a loaded plastic material able to withstand known temperatures of wave soldering, for example of polyamide.

As illustrated at stage 103 in FIG. 4, the array 20,60 of electrically conductive strips (known as the "spider") is then glued flat onto the electrically insulating support 12,52.

The assembly of the strips 20,60 on the support 12,52 can be made by various techniques, such as overmoulding, ultrasonic welding, riveting or simple glueing.

As illustrated at stage 104 in FIG. 4, the method is then continued by cutting and routing of the spider in order to free the inner ends of the conductive strips 20,60 intended to receive the integrated circuit chip 14 and the outer ends of the strips intended to be connected to the winding of the display device and to the external circuit.

The last stage of manufacture consists of providing the curvature of the ends 22,62 of the electrically conductive strips 20,60 as illustrated at the stage 105 in FIG. 4.

The support 12,52 is then ready for receiving the integrated circuit chip 14 as illustrated at stage 106 in FIG. 4.

Various techniques for implanting the integrated circuit chip 14 and the connection of this with the strips 20,60 can be employed.

According to a first technique for implantation and connection, the integrated circuit chip 14 is glued to the support 12,52 then the contacts of the chip 14 are connected to the ends of the electrically conductive strips 20,60 by means of electrically conductive wires in accordance with the known technique of "bonding".

More precisely, the integrated circuit chip 14 can be connected to the strips 20,60 via gold wires by means of the technique of "ball bonding" or by aluminium wires by means of the technique of "wedge bonding".

These techniques of welding generally use ultrasound, one at a temperature between 150° and 180° C. and the other at ambient temperature.

According to another connection technique, the contacts of the integrated circuit chip 14 can be covered with a layer of tinning based on tin and/or lead, as well as the ends of the strips 20,60. The connection of the contacts of the integrated circuit chip 14 and of the strips 20,60 is then carried out by means of refusion soldering of the tinned zones.

As illustrated by the stage referenced 107 in FIG. 4, preferably, the integrated circuit chip 14 and the array of associated electrically conductive strips 20,60 is then potted in an overmoulding of resin, referenced 70. Such overmoulding can be provided in polyurethane. It ensures the protection of the integrated circuit chip 14 and of the associated strips 20,60.

Of course the present invention is not limited to the particular embodiment which has been described but extends to any variants within its scope.

There has been described in the preceding description the possibility of basing the insulating support 12,52 on polyamide. In an advantageous manner, according to the invention, this insulating support can also be provided in polyester loaded with glass, for example in polybutyleneterephtalate or PETP or in polyethyleneterephtalate.

I claim:

1. A display device with a winding a pivoting element of the galvanometic or logometric type, comprising:

a case, a support of electrically insulating material fixed with said case, at least one integrated circuit chip serving as a control circuit for said display device, said integrated circuit chip being carried by said support, a memory included in said integrated circuit chip, said memory defining a parameter connected by a transformation law from size of input electrical control to angle of pivoting of said pivoting element of said device, so that all the display devices produce the same angle of pivoting of the pivoting element when receiving the same electric control signal at the input, even if said display devices have different transformation laws from size of input electric control to pivot angle of the pivoting element, as a result of manufacturing spread, and a series of strips of electrically conductive material carried by said support, said series of strips comprising first strips which connect said integrated circuit chip and at least one said winding of said device, and said series of strips comprising further strips which have each a first end connected to said integrated circuit chip and have each a second end provided with a curve, on an edge of said support, for establishing electric contact between said strips of electrically conductive material and external circuits generating electric control signals.

2. A display device of galvanometric type according to claim 1, comprising electrically conductive return spring connected at a first end to one of said first strips of electrically conductive material, carried by said support, and connected at a second end to said winding for ensuring electric supply of said winding.

3. A display device according to claim 1, wherein said support of electrically insulating material is provided in polyamide.

4. A display device according to claim 1, wherein said device is manufactured in accordance with the following stages:
 (i) providing an array of strips of electrically conductive material,
 (ii) assembling said array of said strips and said relatively rigid support of electrically insulating material by selected one of overmoulding, glueing, ultrasonic welding and riveting,
 (iii) curving certain ones at least of said strips in the region of their ends,
 (iv) implanting said integrated circuit chip on said support.

5. A display device according to claim 4, wherein said integrated circuit chip is connected to said strips of electrically conductive material by means of a technique of "bonding".

6. A display device according to claim 4, wherein said integrated circuit chip is connected to said strips of electrically conductive material by means of a technique of flat transfer and soldering by refusion.

* * * * *